(12) United States Patent
Dalal et al.

(10) Patent No.: US 6,618,267 B1
(45) Date of Patent: Sep. 9, 2003

(54) MULTI-LEVEL ELECTRONIC PACKAGE AND METHOD FOR MAKING SAME

(75) Inventors: Hormazdyar M. Dalal, Milton, NY (US); Gene Joseph Gaudenzi, North Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/158,616

(22) Filed: Sep. 22, 1998

(51) Int. Cl.$^7$ ................................................ H05K 1/14
(52) U.S. Cl. ........................ 361/767; 361/768; 361/803; 361/818
(58) Field of Search ................................ 361/761, 764, 361/767, 803, 807, 816, 818, 820, 768, 804; 257/686, 700, 737, 777, 778; 439/66, 70; 324/754, 755, 758; 228/180.22

(56) References Cited

U.S. PATENT DOCUMENTS

| | | | | |
|---|---|---|---|---|
| 4,699,593 A | * | 10/1987 | Grabbe et al. ................. 439/71 |
| 5,371,654 A | * | 12/1994 | Beaman et al. .............. 361/744 |
| 5,384,955 A | * | 1/1995 | Booth et al. ................... 29/830 |
| 5,468,681 A | * | 11/1995 | Pasch .......................... 438/108 |
| 5,477,082 A | * | 12/1995 | Buckley, III et al. ........ 257/679 |
| 5,557,502 A | | 9/1996 | Banerjee et al. ............. 361/712 |
| 5,570,274 A | * | 10/1996 | Saito et al. .................. 361/784 |
| 5,594,275 A | | 1/1997 | Kwon et al. ................. 257/686 |
| 5,598,033 A | | 1/1997 | Behlen et al. ............... 257/686 |
| 5,639,989 A | * | 6/1997 | Higgins, III ........... 174/35 MS |
| 5,691,041 A | | 11/1997 | Frankeny et al. ............. 428/209 |
| 5,796,170 A | * | 8/1998 | Marcantonio ................ 257/786 |
| 5,834,848 A | * | 11/1998 | Iwasaki ....................... 257/778 |
| 5,838,551 A | * | 11/1998 | Chan .......................... 361/818 |
| 5,854,534 A | * | 12/1998 | Beilin et al. ................. 257/691 |
| 5,953,214 A | * | 9/1999 | Dranchak et al. ........... 361/767 |
| 5,977,640 A | * | 11/1999 | Bertin et al. ................. 257/777 |
| 5,978,229 A | * | 11/1999 | Kim ............................ 361/760 |
| 6,344,688 B1 | * | 2/2002 | Wang .......................... 361/764 |

FOREIGN PATENT DOCUMENTS

| | | | | |
|---|---|---|---|---|
| DE | 43 26 104 A | * | 2/1995 | ............ H05K/1/14 |
| JP | 6-120670 | * | 4/1994 | ............ H05K/3/46 |

* cited by examiner

Primary Examiner—John B. Vigushin
(74) Attorney, Agent, or Firm—Steven Capella

(57) ABSTRACT

A multi-level package, and method for making same, that offers a small size with compartmentalized areas that allow for radiation shielding is disclosed. In its simplest embodiment, the invention comprises two cards and an interposer interposed between the two cards. The interposer preferably has an opening, and the combination of the interposer's opening and the two cards form a cavity. The cavity allows for a high amount of components to be packed into a small, three-dimensional space. The interposer supports can act like a Faraday shield. The two cards and interposer can be multi-layered and support any type of chip or package connection on each side of each card or interposer, including through-hole, surface mount, and direct-chip attachment connections. Finally, pick-up plates or heat sinks can be attached to the package.

28 Claims, 7 Drawing Sheets

Cross Section 1-1'

Top Surface of Top Card

Bottom Surface of Top Card

Top Surface of Interposer

Bottom Surface of Interposer

Top Surface of Bottom Card

Bottom Surface of Bottom Card

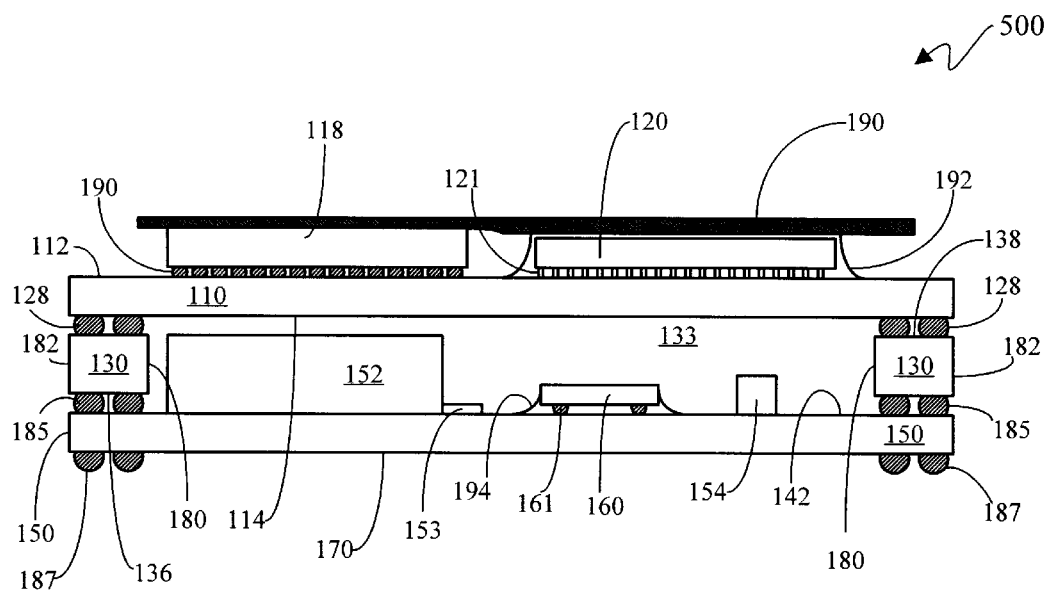
FIG. 4: Cross Section 1-1'
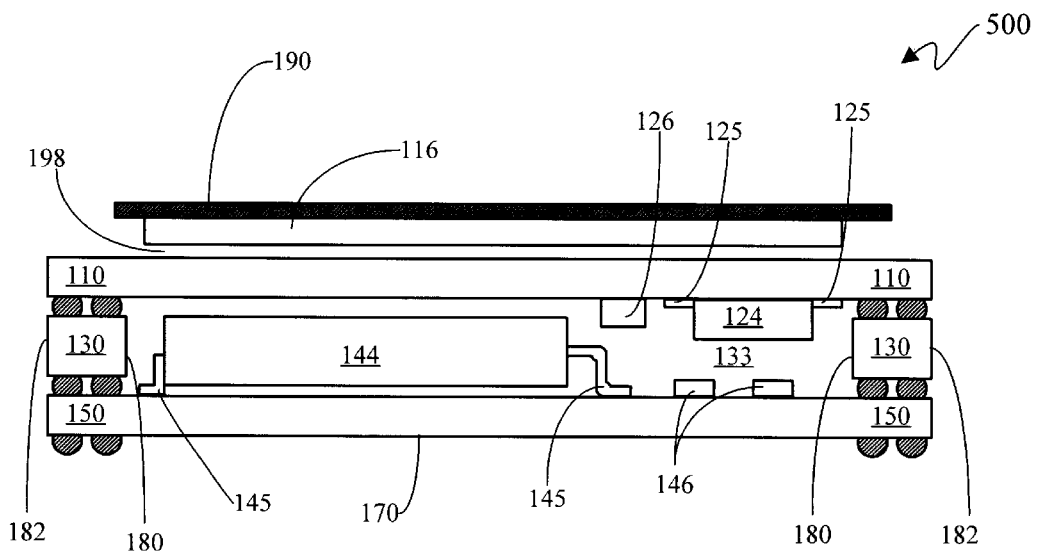
FIG. 5: Cross Section B-B'

FIG. 7: Cross Section 2-2'

MULTI-LEVEL ELECTRONIC PACKAGE AND METHOD FOR MAKING SAME

BACKGROUND OF THE INVENTION

1. Technical Field

This invention generally relates to electronic packaging, and more specifically relates to three-dimensional packaging to package electrical devices.

2. Background Art

The fabrication of integrated semiconductor devices involves forming a plurality of devices on a semiconductor wafer. The wafer is then divided up into a plurality of pieces called "chips" or "semiconductor dies," with each chip comprising one or more semiconductor devices. Each chip is then placed in a "package" that has external connections (generally called "pins" or "leads") to provide accesses to signals on the chip.

Many different packages for integrated circuits have been developed. One popular package is the dual in-line package (DIP). The DIP is commonly a plastic package for many commercial applications, but also comes in ceramic packages for applications that require higher operating temperature. As the number of pins on a package were increased, new packages were developed, such as the pin grid array (PGA). A PGA package typically has rows and columns of pins in an array, and may be either plastic or ceramic as well. As the size of electronic boards continues to shrink, other packages have been developed that provide a higher density of connections in a given space.

For example, surface-mount devices have been developed that have a ceramic package (or module) with solder pads that provide connections to the integrated circuit. These solder pads may be made much smaller than the area required by a pin in prior art DIP and PGA packages, resulting in a higher connection density. These types of surface-mount technology (SMT) packages have various names such as small outline integrated circuit (SOIC), chip scale package (CSP), small outline transistor (SOT), small outline J-lead (SOJ), fine pitch ball grid array (FPBGA), and micro-ball grid array ($\mu$-BGA).

Surface mount modules may be mounted on a variety of different types of circuit boards, circuit modules, or other substrates (referred to herein generically as a "system board"). A system board designed to receive a surface mount module typically provides landing pads that align with the landing pads on the module. Solder balls or solder bumps may be formed on either the module landing pads, the system board landing pads, or both. The surface mount module is then placed on the system board and the entire assembly is heated until the solder balls flow and form a good electrical connection between landing pads. The array of solder balls thus serve as an interconnect mechanism between the landing pads on the module and the landing pads on the system board.

As an example of surface mount modules, ball grid array (BGA) and column grid array (CGA) chip carrier modules have used arrays of solder balls or columns (sometimes referred to as cylinders) as input and output connections. In this application, the term "solder balls" will be used generically to refer to the balls, bumps, columns, cylinders or other suitable connections used as surface mount module interconnects. Generally, the array of solder balls are arranged on a dense pitch of 1.0 and 1.27 millimeters. With a dense array of solder balls covering one side of the module, BGA and CGA modules can provide a large number of input and output connections to the chip in the module without using excessive space.

When the modules are connected to the system board, the modules are flipped over and placed so that the array of solder balls are aligned with the corresponding array of landing pads on the system board. The module and system board are then heated, allowing the solder paste, which is screened on an array of landing pads, to melt and flow into the system board. This establishes the physical and electrical connection between the module and the system board.

Designers are attempting to put more and more packages on one system board. This is happening for several reasons. First, having all the functions on one board makes the design of the system cheaper. Second, designers have become forced to put everything on one board because the physical size of the devices they are developing are becoming much smaller. For instance, global positioning systems, which are very complex digital and analog devices, are being designed now that are hand-held. Such devices require that a large number of packages fit onto one board. The problem that designers are facing is that they are reaching the limits of current board design in that they can pack no more packages on a single board, yet they still desire that more functionality be placed on one board. Also, by using one system board, if a customer only needs the functionality of one part of the board, the only choices the customer has are to either buy the entire board and not use part of the functionality or buy another, completely different board.

One solution to these problems that some designers have tried is to create multi-level packages. By using multi-level packages, the system board can be made to grow upward instead of outward. Thus, more circuits may be packed onto the same two dimensional boards. These multi-level packages generally have multiple levels of chips, each level of chips being attached to the next level of chips through some type of connection means (SOJ, SOIC, etc.).

There are several problems with multi-level chip designs. First, the multi-level designs do not readily allow for "mix and match" components. In other words, if a customer wishes to use a first company's digital signal processor (DSP) with a different company's radio frequency (RF) electronics, the customer basically has to make his or her own system board on which to place these various packages. This can be very expensive and time consuming.

Second, radio frequency or electrical shielding is limited or nonexistent in these multi-level packages. This limits the types of devices that can be placed in a multi-level package. Current multi-level packages that contain RF and digital devices will perform poorly because of the lack of electrical shielding between the RF and digital devices. For mixed packages, electrical shielding is very important because digital devices will generally emit electrical emissions at around the frequency of operation and at harmonics thereof. These emissions will negatively affect both RF components and, to a lesser degree, other digital components. RF components may begin to intermittently track the frequency or harmonics of the digital components. Or RF components may "add" these stray emissions to their input or output data stream, thus yielding incorrect data. In addition, RF components will generally emit their own electrical radiation. This radiation may affect the digital devices if the devices are not isolated in an insulating package, although the effect of this radiation is somewhat less than the effect of digital radiation on RF components.

There are a variety of techniques used to reduce or eliminate electrical radiation between or from digital or RF components. For instance, ground planes for the two devices may be kept completely separate or are joined at only one point. In addition to this method, a well-known and respected method of reducing radiation from a device (particularly an RF device) is a Faraday shield. Faraday shields are generally "cans" made of metal. The can is placed over sensitive components and the metal can is then grounded. The grounded metal layer of the can prevents electromagnetic emissions emitted inside the can from escaping the can. The grounded layer also prevents electrical emissions emitted outside the can from entering the inner portion. These cans are generally grounded in several places around the can's periphery.

Current multi-level packages, however, do not allow for cans or other shielding to prevent or reduce the effects of electronic radiation. Thus, mixed digital and RF components cannot be used together in a multi-level device without having each device exposed to possible electronic radiation and its accompanying errors.

Without a way to easily join products from several vendors in an extensible, compartmentalized, three-dimensional design while allowing mixed digital and analog components having radio frequency shielding between the two types of components, system board designers will be relegated to designing new, larger boards and may have to make end products larger to fit the boards.

DISCLOSURE OF INVENTION

The preferred embodiment of the present invention provides a multi-level package, and method for making the package, that offers a small size with compartmentalized areas that can allow for radiation shielding.

The package comprises cards and interposers that are stacked upon one another to allow for small, efficient package size. In its simplest embodiment, the invention comprises two cards and an interposer interposed between the two cards. Each card is able to have packages, chips, or devices on both sides. The interposer preferably has an opening, and the combination of the interposer's opening and the two cards form a cavity. The cavity allows for a high amount of components to be packed into a small, three-dimensional space. The interposer supports metal routing and through-hole connections and, in combination with both cards, will act like a Faraday shield. Components inside the cavity will be shielded from electromagnetic radiation emanating from outside the cavity and components outside the cavity will be shielded from electromagnetic radiation emanating from inside the cavity. The two cards and interposer can be multi-layered and support any type of chip or package connection, including through-hole and surface mount connections.

The foregoing and other features and advantages of the invention will be apparent from the following more particular description of the preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 4 shows a cross-sectional view of a preferred embodiment of the present invention;

FIG. 5 shows another cross-sectional view of a preferred embodiment of the present invention;

BEST MODE FOR CARRYING OUT THE INVENTION

Figure 1A:
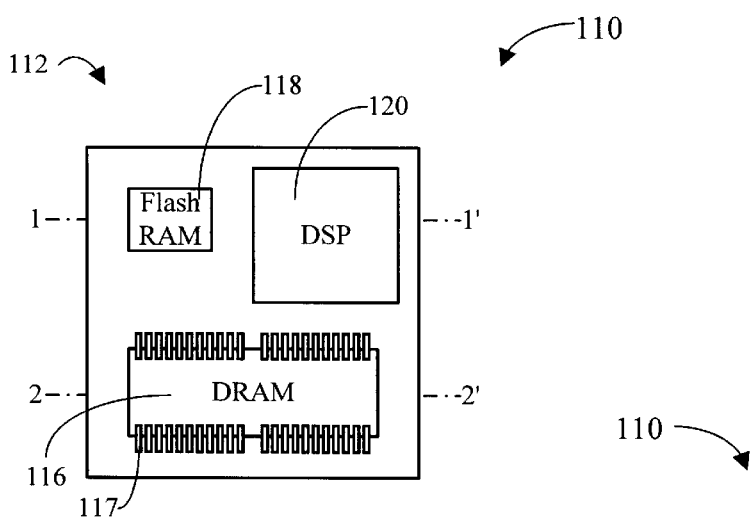
FIG. 1 shows several views of a top card in accordance with a preferred embodiment of the invention.

A preferred embodiment of the present invention provides a multi-level package, and method for making the package, that offers a small size while providing compartmentalized RF and digital areas and radiation shielding for both, if shielding is desired.

The package comprises cards and interposers that are stacked upon one another to allow for small, efficient package size. In a preferred embodiment, the invention comprises two cards and an interposer interposed between the two cards. Each card is able to have packages, chips, or devices on both sides. The interposer preferably has an opening, and the combination of the interposer's opening and the two cards form a cavity. The cavity allows for a high amount of components to be packed into a small, three-dimensional space. The interposer supports metal routing and through-hole connections and, in combination with both cards, will act like a Faraday shield. Components inside the cavity will be shielded from electromagnetic radiation emanating from outside the cavity (and vice versa). The two cards and interposer can be multi-layered and support any type of chip or package connection, including through-hole and surface mount connections.

In a preferred embodiment of the invention, each card and interposer is preferably an organic laminate card. These cards can be multi-layered and can support any chip or package attachment methods, such as through-hole or surface-mount technology (SMT) or direct-ship attachment methods, known to those skilled in the art. Digital components are preferably placed on the top of the top card. Radio frequency (RF) components are preferably placed on the bottom of the top card and on the top of the bottom card. This design allows the RF components to have the greatest amount of shielding and should shield the digital components from the RF components as well. In addition, this allows separate digital and RF ground planes. The interposer is preferably a square or rectangular, ring-shaped circuitized structure with ball grid arrays (BGAs) on both the top and bottom surfaces that connect the interposer to the bottom of the top card and the top of the bottom card. The bottom of the bottom card will generally have only a BGA, the BGA preferably being in a joint electron device engineering council (JEDEC) standard array structure to be able to join one multi-level BGA package to another multi-level BGA package. JEDEC is an association that governs standardization rules for electronic packaging.

This packaging scheme has many advantages. Because each card can be a completely separate entity containing analog and/or digital components, each card can be separately designed and tested. Yet, the two cards can be placed together to make a complete digital and RF solution for highly compact systems such as global positioning satellite (GPS) systems. Hand-held GPS systems, in particular, need both RF and digital components placed into as small a space as possible. Furthermore, each card can be sold to customers as a separate package: If the customer wants only the digital card, the customer only need buy the digital card. Components from any vendor can be used on a card and the card joined with the other card by the customer or the distributor. For instance, if the customer chooses to use a first company's RF components with a different company's digital signal processor (DSP), this is possible. Because the package grows upward and not outward, the size of the system board can be dramatically reduced or even eliminated, or the system board's size may be kept the same and more functionality added to the board. Finally, the package allows attachment of heat sinks or other devices to the top of the package.

Figure 6:
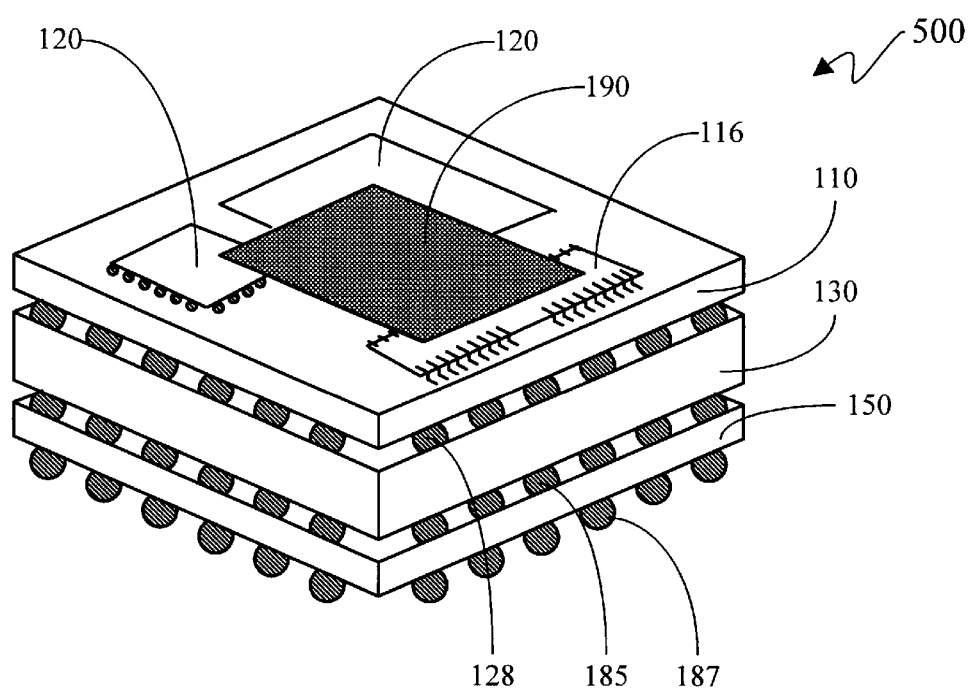
FIG. 6 shows a three-dimensional view of a preferred embodiment of the present invention.

Turning now to FIGS. 1–6, the simplest preferred embodiment of the multi-level package is shown. FIG. 1 shows top card 110; FIG. 2 shows interposer 130; and FIG. 3 shows bottom card 150. Top card 110 and bottom card 150 are preferably circuitized cards having through-holes, landing pads, and other similar circuitized mechanisms able to interconnect electronic components to themselves and the card. FIGS. 4 and 5 show cross-sectional views of the three levels as they are preferably connected to create a single, multi-level package. FIG. 6 shows a three-dimensional view of an embodiment of the present invention. Each card supports many different types of components and connection methods for those components. The term "components" is meant to encompass any electrical device, chip, or package that can be mounted to a circuitized card in any known or to be invented manner. The components shown in FIGS. 1–6 are merely exemplary and are not meant to be limiting in any way. FIGS. 4, 5 and 6 show an embodiment of a complete package, wherein interposer 130 is interposed between, and connected to, top card 110 and bottom card 150. The connection mechanisms are preferably ball grid arrays (BGAs), but could be any method for connecting cards or interposers known to those skilled in the art.

Interposer 130 has an opening 134 defined by inside edge 180. Inside edge 180, its corresponding opening 134, bottom surface 114 of top card 110, and the top surface 142 of bottom card 150, define a cavity 133. Cavity 133 preferably contains a multiplicity of components. These components preferably require electromagnetic shielding, and one or more grounded solder balls 182, 185, and/or 187 on interposer 130 form an electromagnetic (or Faraday) shield. Thus, cavity 133 allows for a very compact, yet three-dimensional package that can offer Faraday shielding.

Turning now to FIG. 1, FIG. 1 show three views of one card of a preferred embodiment of the present invention. FIG. 1A shows a top view of top card 110 and the various exemplary digital components on top card 110. All components shown in FIGS. 1–6 are exemplary only. Top surface 112 of top card 110 has a flash random access memory (RAM) 118, a digital signal processor (DSP) 120 and a dynamic random access memory (DRAM) 116. Flash RAM 118, DSP 120, and DRAM 116 are connected to top surface 112 through any manner known to those skilled in the art. For instance, any SMT packaging scheme such as small outline integrated circuit (SOIC), chip scale package (CSP), small outline transistor (SOT), small outline J-lead (SOJ), fine pitch ball grid array (FPBGA), and micro-ball grid array ($\mu$-BGA), thin small outline package (TSOP), etc. may be used. In addition, direct chip attachment mechanisms (wire-bonding or direct chip attach by using low temperature solder bump) or through-hole mechanisms may be used. FIG. 1A, in conjunction with FIG. 4, shows three different connection schemes. DRAM 116 is connected to top surface 112 by SOJ leads 117. The connection schemes for flash RAM 118 and DSP 120 will be discussed in reference to FIG. 4.

Not shown in FIG. 1 is the routing between DRAM 116, DSP 120, and flash RAM 118. These devices must be connected somehow and the routing for the metal vias between the components may be performed by any manner known to those skilled in the art, such as plated through-holes; surface laminated circuits, etc. Top card 110 is preferably at least a four-layer board with power, ground, and two signal planes. Also not shown in FIG. 1 are the through-holes that connect top surface 112 to bottom surface 114 of top card 110. These through-holes electrically connect signals from the components on top surface 112 to components on bottom surface 114.

Figure 1B:
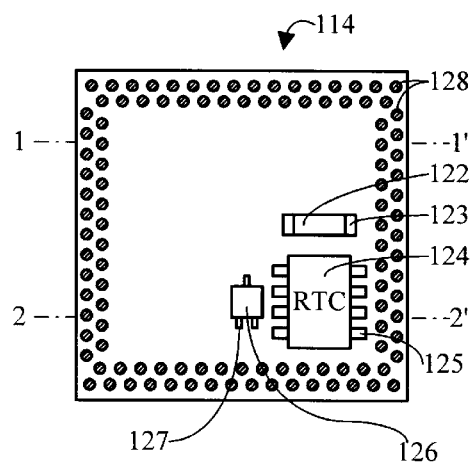

FIG. 1B shows the bottom surface 114 of top card 110. On bottom surface 114 of top card 110 are shown several exemplary components. Bottom surface 114 has real-time clock (RTC) 124, 20 megahertz (MHz) crystal 122, and power manager 126. RTC 124 has a multiplicity of leads 125, 20 MHz clock 122 has two leads 123, and power manager 126 has three leads 127. Again, these components are connected to bottom surface 114 by any method known to those skilled in the art. On the periphery of bottom surface 114 are solder balls 128 of a BGA. Underneath solder balls 128 will be landing pads (not shown) that electrically connect solder balls 128 to the through-holes or metal routing or vias to which the landing pads are connected. Not shown in FIG. 1B are the metal vias connecting RTC 124, 20 MHz crystal 122 and power manager 126 to themselves and, if necessary, to DRAM 116, flash RAM 118, and DSP 120.

Once top card 110 has all the required components on it, the card can be tested to ensure that it is completely functional. This testing may occur before or after solder balls 128 of the BGA on the periphery of bottom surface 114 are attached to bottom surface 114. After testing, and potentially burn-in, top card 110 should be a complete product that may be sold to customers.

Figure 1C:
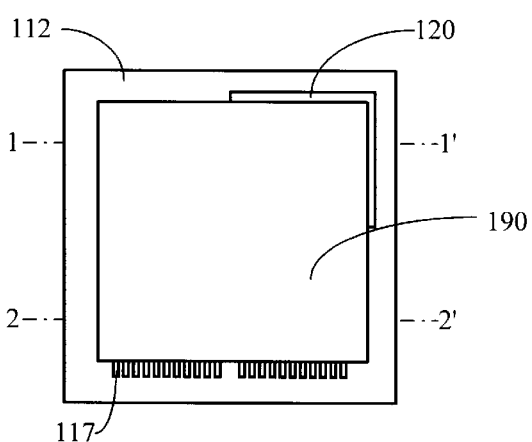

FIG. 1C shows a pick up plate 190 attached to the components on top card 110. Pick up plate 190 preferably serves several purposes. First, pick up plate 190 allows a mechanical, vacuum-run device to pick up top card 110 (and anything connected to top card 110) to place top card 110 on another surface for further processing or on a surface whereby top card 110 will be attached to another card. Second, pick up plate 190 acts as a heat sink (this is more apparent in FIGS. 4 and 5). Finally, pick up plate 190 can be joined to an even larger or differently shaped heat sink or a heat sink with a fan attached to enhance heat reduction.

Figure 2A:
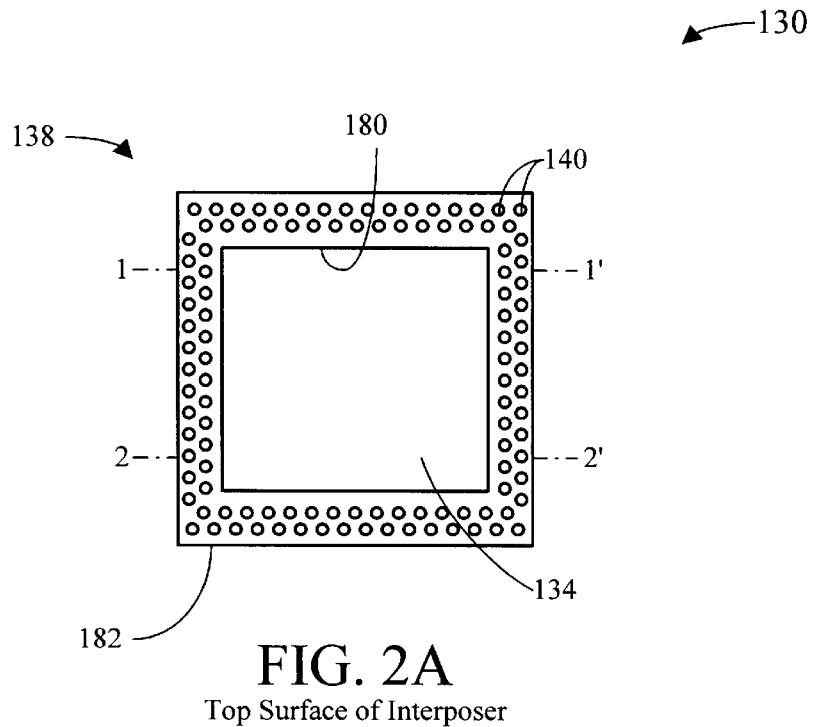
FIG. 2 shows several views of an interposer in accordance with a preferred embodiment of the invention.
Figure 2B:
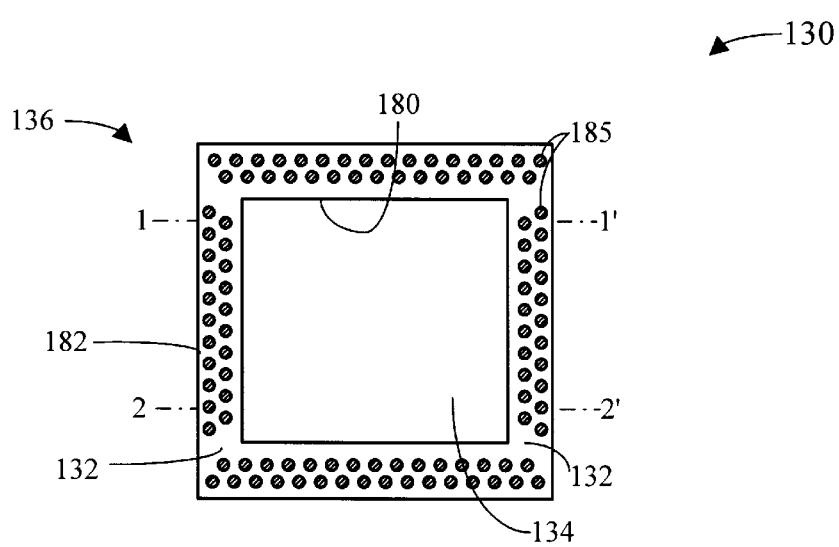

Turning now to FIG. 2, FIG. 2 shows two views of an interposer designed in accordance with a preferred embodiment of the present invention. FIG. 2A shows a top view of interposer 130 and FIG. 2B shows a bottom view of interposer 130. Interposer 130 is preferably a multi-layer board. Referring to both FIGS. 2A and 2B, interposer 130 has a top surface 138, a bottom surface 136, an outside edge 182 and an inside edge 180. Inside edge 180 defines opening 134. In combination with top card 110, bottom card 150, and solder balls 128, 185, and 187, inside edge 180 defines cavity 133 (illustrated in FIGS. 4 and 5). Cavity 133 will be more particularly described with reference to FIGS. 4 and 5. Arrayed around the periphery of top surface 138 of interposer 130, between inside edge 180 and outside edge 182, are landing pads 140. These pads will make electrical contact with, be joined with, and are aligned with solder balls 128 on the bottom surface 114 of top card 110. Arrayed around the periphery of bottom surface 136 of interposer 130, between inside edge 180 and outside edge 182, are more solder balls 185. Behind each solder ball 185 on bottom surface 138 of interposer 130 is a landing pad 140 (not shown in FIG. 2B). Solder balls 185 and landing pads 140 on the bottom surface 136 of interposer 130 can be of different sizes and locations than solder balls 128 and landing pads 140 that join interposer 130 to top card 110.

Not shown in FIG. 2 are the metal vias electrically connecting individual landing pads 140 (on either top surface 128 or on bottom surface 136) to other landing pads 140 (on either top surface 138 or on bottom surface 136). In addition, through-holes that connect landing pads 140 on top surface 138 to other landing pads 140 on bottom surface 136, or vice versa, are also not shown.

In a preferred embodiment of the invention, the arrays of solder balls form two layers of metal "cages" whereby interposer 130, the solder balls, top card 110 and bottom card 150 will act as a Faraday or electromagnetic shield for any components placed in cavity 133. Much like the screen covering the window of a microwave oven, the cages of solder balls should prevent most radiation from entering or leaving cavity 133. To act as a Faraday shield, at least some landing pads 140 must be grounded. Preferably, the corner and middle landing pads 140 would be grounded. For an interposer that is a square, with each side being 25 millimeters (mm), grounding the corner and middle landing pads 140 will result in approximately 12 mm spaces between grounded balls. It is generally known that a wavelength significantly longer than the distance between grounded areas should not be able to pass through the grounded areas (in this case, the grounded balls). Using the well known formula that the speed of light is equal to frequency times wavelength, and using 12 mm as the wavelength, the frequency of radiation would be about 25 gigahertz. This result indicates that frequencies less than 25 gigahertz should be rejected by a caged structure having 12 mm between each grounded ball.

Of course, this is only a simplistic estimation, because such influencing factors as the amplitude of the waveform attempting to pass through the caged structure have not been taken into account. However, the structure should provide good shielding up to a high frequency. It is recommended that the balls being grounded to create a Faraday shield be selected with approximately equal spacing between grounded balls. If this cannot be performed, the largest space between grounded balls will be the limiting factor as to the radiation shielding capability of the package. For instance, if the package is as previously described, but one side of the square is only grounded twice at each end of this side, then the limiting wavelength will be about 25 mm. This would halve the rejected radiation frequency to about 12 gigahertz. Finally, a certain minimum number of balls must be grounded for the interposer and cage to act as a Faraday shield. Those skilled in the art should keep these concepts in mind when selecting an appropriate grounding scheme.

Although interposer 130 is shown in the preferred embodiment as a square or rectangular ring, other embodiments are possible. In particular, interposer 130 may be made in panel or "window pane" form to ease manufacturing. In this manufacturing process, strips or panels that consist of multiple interposer sections are made. Each interposer section is joined to another interposer section through one or more lines that may be easily broken. In the particular embodiment being described, each interposer section would be shaped like a square or rectangular ring. Layers of similarly made strips would then be laminated together until multiple interposers are developed, complete with routing. The lines between interposers are then broken and each interposer is complete.

Figure 3A:
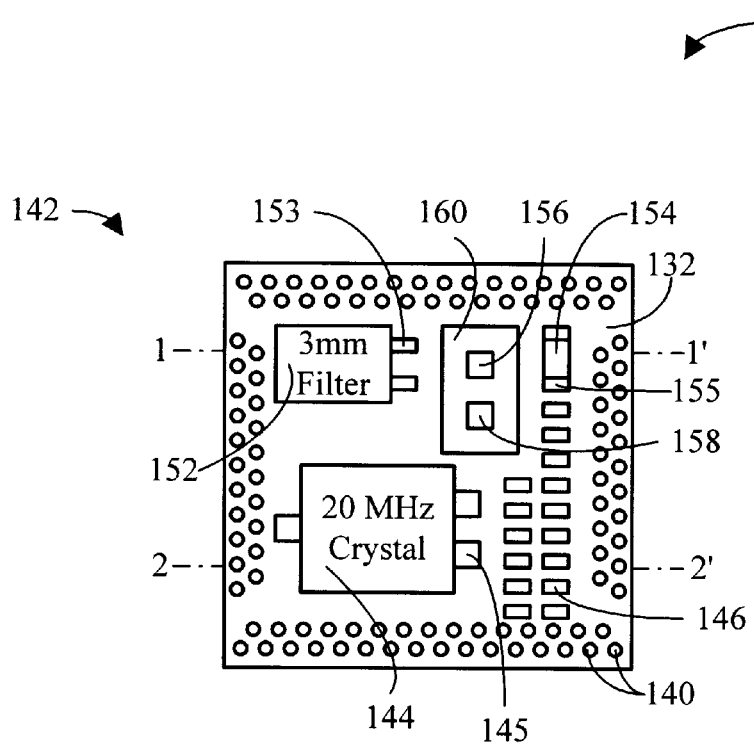
FIG. 3 shows several views of a bottom card in accordance with a preferred embodiment of the invention.
Figure 3B:
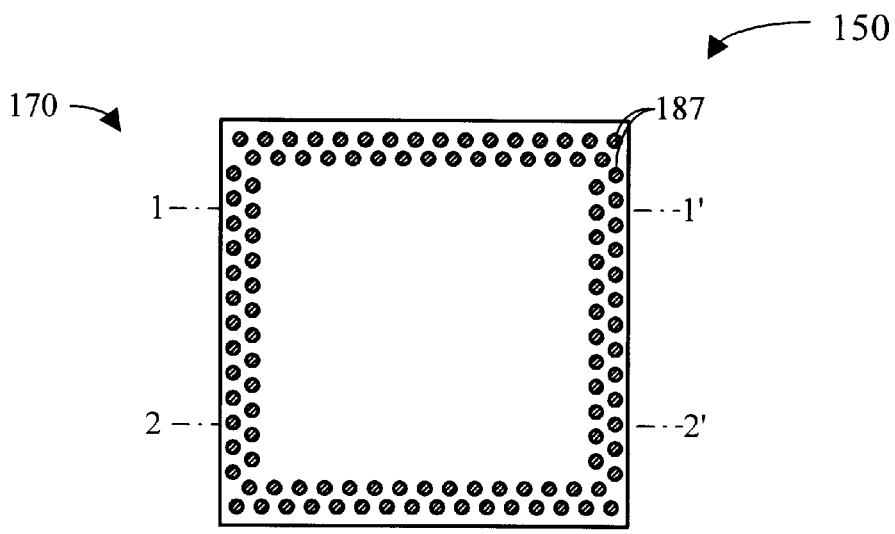

Turning now to FIG. 3, FIG. 3 shows two different views of bottom card 150. FIG. 3A shows a top view of bottom card 150, while FIG. 3B shows a bottom view of bottom card 150. Top surface 142 of bottom card 150 has the following exemplary components: 3 mm 1.55 MHz filter 152 with leads 153; an RF processing section 160; an inductor 154 having leads 155; a 40 MHz crystal 144 having leads 145; and multiple passives 146. Passives 146 will generally be either resistors or capacitors. RF processing section 160 is a chip attached through direct chip attachment methods to top surface 142 of bottom card 150, and RF processing section 160 includes a direct-chip attached low noise amplifier (LNA) 158 and RF signal processing IC chip 156. All other components are attached to top surface 142 of bottom card 150 through any means known to those skilled in the art.

Around the periphery of the top surface the bottom card are a multiplicity of landing pads 140. The various devices are connected together and to landing pads 140 through signal lines that run on top surface 142 of bottom card 150. Around the periphery of bottom surface 170 of bottom card 150 are more landing pads 140 that are hidden in FIG. 3B by solder balls 187. As with previous cards, through holes and/or metal vias can connect landing pads 140 (on either bottom surface 170 or top surface 142 of bottom card 150) to other landing pads 140 (also on either bottom surface 170 or top surface 142 of bottom card 150). Also, solder balls 187 and landing pads 140 can be of different sizes and of different placement than the solder balls and landing pads that join interposer 130 to top card 110 and interposer 130 (see FIGS. 4 and 5) to bottom card 150. It should also be noted that solder balls 187 do not have to be peripherally placed; they could be placed in the middle of bottom card 150 or entirely cover bottom card 150.

FIGS. 4 and 5 illustrate, through cross-sections 1—1' and 213 2' (of FIGS. 1–3), respectively, that one particular embodiment of the present invention, package 500, comprises top card 110, interposer 130, and bottom card 150. Top card 110 is electrically and physically connected to interposer 130 through solder balls 128. Interposer 130 is also connected to bottom card 150 through solder balls 185. Solder balls 187 on bottom surface 170 of bottom card 150 are used to electrically and physically connect package 500 to a system board or other device (not shown). Thus, all packages and chips on top card 110 are able to be connected to other packages and chips on bottom card 150 and to a system board through landing pads 140 and solder balls. Also, FIGS. 4 and 5 illustrate that cavity 133 not only is defined by inner surface 180 of interposer 130, but also is defined by bottom surface 114 of top card 110, top surface 142 of bottom card 150, and the solder balls 128, 185, and 187. Also note that inner surface 180 of interposer 130 defines opening 134. Opening 134 is shown in FIG. 2 but is not shown in FIGS. 4 and 5 to prevent confusion. The components in cavity 133 may be on either the top surface 142 of bottom card 150, on the bottom surface 114 of top card 110, or on both. The thickness of interposer 130 can be adjusted to accommodate the height of the desired components on the top surface 142 of bottom card 150 or on the bottom surface 114 of top card 110. Cavity 133 provides for a very compact, three-dimensional package, as illustrated by FIGS. 4 and 5.

In addition, by providing one or more grounds through solder balls 128, 185, and 187, interposer 130 will act as a Faraday shield to keep electronic radiation from passing through itself. In particular, the combined package of top card 110, interposer 130, bottom card 150, and solder balls 128, 185, and 187 should prevent most electromagnetic radiation from passing into or out of cavity 133. Thus, components in cavity 133 will be less affected by external electronic radiation generated by components outside of cavity 133. In addition, components on top surface 112 of top card 110 will be shielded from electronic radiation generated by components in cavity 133. For interposer 130 to act as a Faraday shield, one or more solder balls between bottom surface 114 of top card 110 and interposer 130, between top surface 142 of bottom card 150 and interposer 130, or between bottom surface 114 of top card 110 and interposer 130 and top surface 142 of bottom card 150, should be grounded.

FIGS. 4 and 5 also illustrate the many different ways in which devices can be attached to a card. FIG. 4 shows flash RAM 118 being connected to top card 110 through μ-BGA 190, DSP chip 120 being connected to top card 110 through direct chip attachments (C4/tincap) 121, 3 mm 1.55 MHz filter 152 being attached through normal soldering techniques, with its leads 153 attached to bottom card 150, and RF processing section 160 being attached through direct chip attachment means (C4/tincap 161 and underfill 194) to bottom card 150. The direct chip attachment of DSP chip 120 and RF processing integrated circuit (IC) 160 require encapsulation/underfill 192 and 194, respectively. These encapsulations/underfills generally must be cured for some time. Direct chip attachment can be C4/tincap solder balls, as shown in FIG. 5, or wire bonding, or any other method of directly attaching a semiconductor chip to a circuitized card. FIG. 5 shows 40 MHz crystal 144 attached to bottom card 150 through its large leads 145 and RTC 124 being attached to top card 110 through its leads 125.

FIGS. 4 and 5 also show pickup plate 190 being attached to the TSOP body of DRAM 116. The means for attaching pickup plate 190 can be any means known to those skilled in the art for attaching a plate to a package or a chip. Optionally, a thermally conducting grease could be placed between the pickup plate 190 and DSP chip's 120 surface to enhance thermal cooling of DSP chip 120.

FIGS. 4 and 5 illustrate that component placement for the various cards is important. If a tall component is placed on the bottom surface 114 of top card 110, then another tall component should not be placed on the top surface 142 of bottom card 150 or else the two components may touch when, and if, the surfaces are connected through interposer 130. Of course, if these components should still need to be in their respective places on their respective cards, a taller interposer 130 may be used to alleviate this problem.

Referring now to FIG. 6, FIG. 6 shows the previously discussed components and cards in a complete, three-dimensional package. FIG. 6 illustrates the compact and three-dimensional nature of package 500. Package 500, in a preferred embodiment, has both digital and analog sections that can provide a complete, integrated solution for handheld devices needing both RF and digital components.

Finally, it should be understood that this packaging scheme is extendible. Should another layer of digital electronics be required, another interposer 130 (the second interposer) and its corresponding sets of solder balls could be placed on top surface 112 of top card 110 to join top card 110 to yet another card on top of interposer 130. Thus, this second "top" card 110 would connect components on it to the components on top card 110 through the second interposer 130. In addition, should another layer need to be added after bottom card 150, a third interposer 130 could be added beneath bottom card 150 to connect a second "bottom" card 150 to the first bottom card 150.

Figure 7:
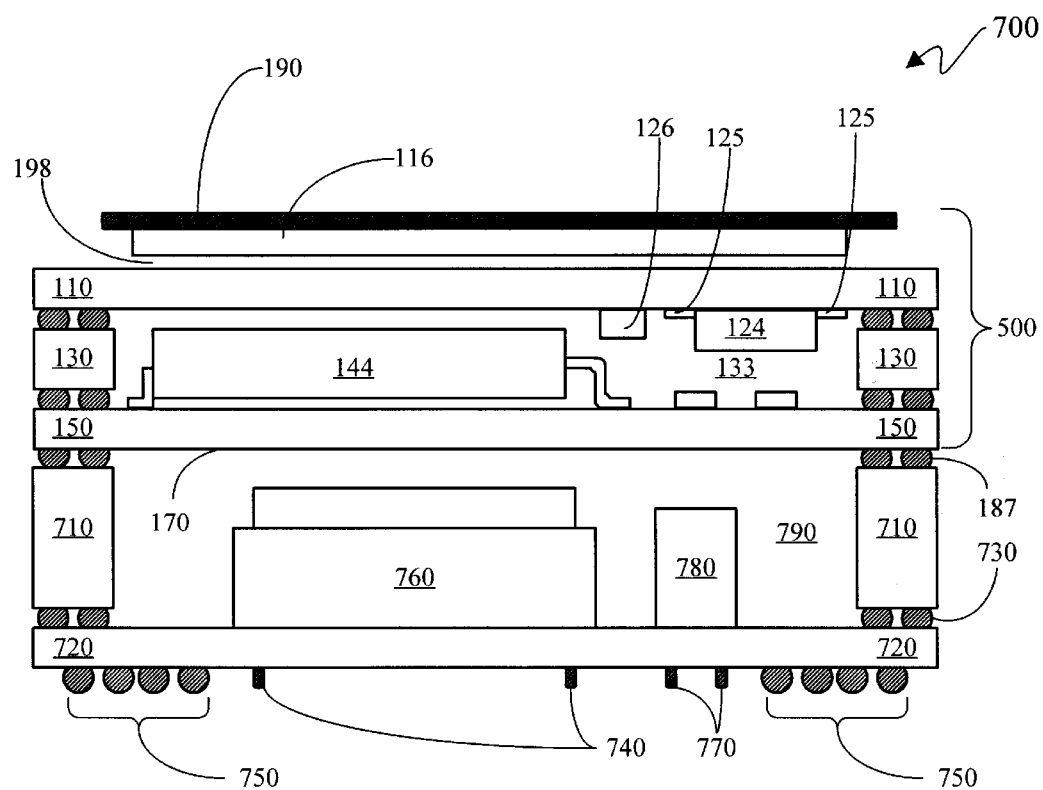
FIG. 7 shows a cross-sectional view of another preferred embodiment of the present invention.

These concepts are illustrated in FIG. 7. FIG. 7 shows another cross-sectional view of package 500 where another interposer 710 has been added to join a third card 720 to package 500 to create package 700. Third card 720 is a circuitized card containing pads, through-hole connections, vias and the like for interconnecting electronic components to themselves and third card 720. Interposer 710 in this example is much higher (or deeper) than interposer 130, and interposer 710 joins third card 720 to bottom card 150 through solder balls 187 and 730. Solder balls 750 allow package 700 to be joined to another package or system board. Another cavity 790 is formed by an opening in interposer 710 (the opening is not numbered or shown in FIG. 7 to prevent confusion), bottom card 150, and third card 720.

On third card 720 are exemplary components capacitor 780 and transformer 760. Both capacitor 780 and transformer 760 are joined to third card 720 by through-hole pins 770 and 740, respectively. The components placed on third card 720 are merely exemplary. These components could be analog or digital or mixed analog and digital. In addition, further components could also be placed on bottom surface 170 of bottom card 150. Interposer 710 could be specifically grounded to act as a Faraday shield or not specifically grounded for this purpose. FIG. 7 shows the variety of different configurations that packages made in accordance with the present invention can encompass. Only this cross section (2—2') will be shown, as the cross section for 1—1' is similar. What is important is that packages made in accordance with the present invention allow an extensible, three-dimensional, highly compact structure that supports a vast array of components.

Figure 8:
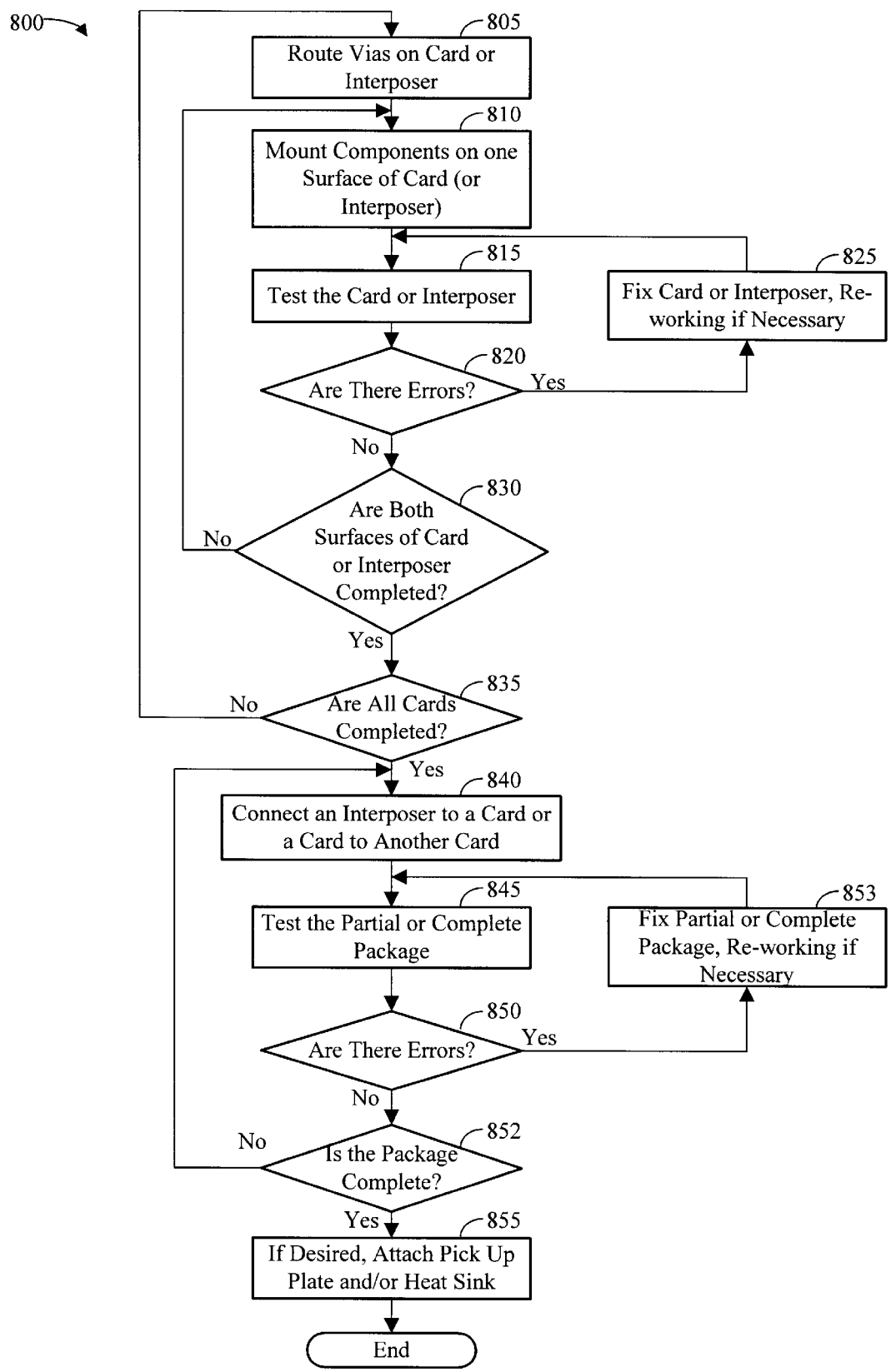
FIG. 8 diagrams a method for using a preferred embodiment of the present invention.

Turning now to FIG. 8, FIG. 8 shows a method for making packages 500 or 700 in accordance with these preferred embodiments of the invention. Method 800 begins in step 805 when vias are routed to connect the components that will be placed on the card to each other and to landing pads 140. Generally this routing step will not be performed because the entire card will usually be constructed by a card manufacturer, and the card will already have vias on it when it is received by the manufacturer. However, the step illustrates that the card will generally have all layers, through-holes, landing pads, and other similar routing and connections to enable the proper connection of components and interposers. Interposers also need to have the correct routing formed on them or the correct through-holes formed in them. In addition, electrical connections from interposer 130 to grounds on top card 110 and/or bottom card 150 must be made to ensure that interposer 130 will act as a Faraday shield.

Once the routing and electrical connections are set up, the next step performed (step 810) is to mount components on one side of a card. Mounting the components encompasses all steps known to those skilled in the art that are necessary to mount a component. In particular, encapsulation for direct mount chips will need time to cure and more than one step may be involved in mounting a direct mount chip onto a card. For instance, there will likely need to be some type of low temperature solder flow to mount the chip onto the card.

Then the encapsulation or underfill will have to be applied and cured. What is important is that chips or packages can be mounted in a variety of different ways to a card. This step also encompasses adding components to an interposer, but, because of its small size, preferably only small components such as resistors or capacitors will be added. In addition, solder balls may be placed on the card during step 810 if desired.

Once all needed components are connected to one surface of a card, the functionality of the card or interposer may be tested. This is done in step 815. This testing can take any form known to those skilled in the art, e.g. burning in and testing using sockets. It is also possible that the step of testing can be delayed until both sides of a card have the required components on them. If errors during testing are found (step 820=Yes), the errors are fixed and the card is re-worked, if necessary. This repair or rework occurs in step 825. Reworking can be as complex as a complete redesign and rebuild of the card, but re-working will generally only require minor modifications to the card or interposer. If a complete redesign is necessary, step 805 will again be the first step performed. If a complete redesign is not necessary, the card will be retested, in step 815, after minor modifications have been made.

If both surfaces of the card are to have components on them, step 835 is a check to ensure that both surfaces of the card are completed. If another surface of the card needs components placed on that surface (step 835=No), then steps 805 through 820 are performed to add the components and test the functionality of the card or interposer.

Once all cards are completed (step 835=Yes), then the cards will generally be connected to each other. Generally, cards will not be joined until step 840 because it is much easier to test cards and/or interposers individually than after they are joined. However, if desired, step 840, wherein interposers and cards are interconnected, may be moved between steps 830 and 835. Preferably, though, all cards will be completed and have components on them before the cards are connected to interposers or other cards. In step 840, an interposer is connected to a card. As an example, top card 110 could be joined to interposer 130 in this step. Solder balls may be placed on the card or on the interposer during this step or solder balls may already be on the cards, having been placed there in step 810. The partial package is then tested, if desired, in step 845. If there are errors (step 850=Yes), the package is re-worked in step 853. Generally this will be a small re-work because the cards themselves will generally already have been tested in step 815.

If there are no errors (step 850=No), completion of the package is then checked. If the package is complete in step 852 (step 852=Yes), by having all boards and interposers connected, a pick up plate and/or heat sink can be attached to the top surface of the package in step 855. If another layer has to be added (step 852 =No), such as if interposer 130 must be connected to bottom card 150, then steps 840 to 850 will be completed to add another card or interposer to the package. Once all interposers, cards and optional heat sink/pick up plate have been added to the package, package is complete. The package may now be joined to a system board or, if desired, another package.

While the two cards, interposers, and system boards have been described as being joined through BGAs, any method known to those skilled in the art may be used to actually connect the cards, interposer, and system boards.

Thus, the preferred embodiment provides an apparatus and method for creating an extensible multi-level package that can have separate, shielded areas for digital and RF components. Heat dissipation is also accomplished through the use of pick up plates and/or heat sinks. This multi-level package allows the cards that make it up to be individually tested and sold, and it allows different cards from different manufacturers to be used in the same package. The preferred embodiments of the present invention allow a very compact, three-dimensional package that can house any number of components having a wide variety of attachment or connection methods.

While the invention has been particularly shown and described with reference to preferred exemplary embodiments thereof, it will be understood by those skilled in the art that variations in form and detail may be made therein without departing from the spirit and scope of the invention.

What is claimed is:

1. A package for containing electronic components, the package comprising:

a first circuitized card;

a second circuitized card;

an interposer interposed between the first and second circuitized cards, the interposer having an opening the opening in the interposer and the first and second circuitized card forming a cavity for containing at least one electronic component wherein the first circuitized card has a bottom surface and there Is at least one component mounted to the bottom surface, wherein the interposer, first circuitized card, and second circuitized card are circuitized multi-layer organic laminate cards, wherein the first circuitized card and interposer electrically and physically connected through a ball grid array and the interposer and the second circuitized card are electrically and physically connected through a ball grid array.

2. The package of claim 1 wherein the interposer, first circuitized card and second circuitized card act as a Faraday shield for electronic components placed inside the cavity.

3. The package of claim 2 wherein the interposer has at least one connection to at least one ground.

4. The package of claim 3 wherein the at least one connection is a multiplicity of connections to the at least one ground, the distance between a connection and its closest neighboring connection being approximately equal.

5. The package of claim 1 wherein the opening is square and is in the approximate center of the interposer.

6. The package of claim 1 wherein the first circuitized card has a top surface and there is at least one component mounted to the top surface.

7. The package of claim 1 wherein the second circuitized card has a top surface and there is at least one component mounted to the top surface.

8. The package of claim 1 wherein the second circuitized card has a bottom surface and there is at least one component mounted to the bottom surface.

9. The package of claim 1 wherein the second circuitized card has a bottom surface and the bottom surface has a ball grid array allowing connection to a system board.

10. The package of claim 1 wherein the first circuitized card has a top surface, the second circuitized card has a top surface and a bottom surface, and there is at least one component on the top surface of the first circuitized card, and there is at least one component on the top surface of the second circuitized card.

11. The package of claim 1 wherein at least one component is mounted to the first circuitized card and wherein the at least one component is attached to a heat sink or pick-up plate.

12. The package of claim 1 wherein the cavity contains at least one component.

13. The package of claim 12 wherein the at least one component inside the cavity is attached to a bottom surface of the first circuitized card or a top surface of the second circuitized card and wherein the at least one component is attached to the bottom surface of the first circuitized card or the top surface of the second circuitized card through surface mount attachment, direct chip attachment or through-hole attachment.

14. The package of claim 1 wherein the first circuitized card has a top surface and there is at least one component attached to the top surface of the first circuitized card through surface mount attachment, direct chip attachment or through-hole attachment.

15. A package for containing electronic components, the package comprising:
- a first circuitized card having a top and bottom surface;
- a second circuitized card having a top and bottom surface;
- an interposer having an opening, a top surface, and a bottom surface, the interposer being electrically connected to the first circuitized card and the second circuitized card through a first and second set of connections, the first set of connections being interposed between the bottom surface of the first circuitized card and the top surface of the interposer, the second set of connections being interposed between the bottom surface of the interposer and the top surface of the second circuitized card, wherein (a) the bottom surface of the second circuitized card has a third set of connections for attaching the second circuitized card to a system card, (b) the opening in the interposer, the bottom surface of the first circuitized card, and the top surface of the second circuitized card form a cavity for containing at least one electronic component, (c) the Interposer, first circuitized card, and second circuitized card are circuitized multi-layer organic laminate cards, and (d) each set of connections of the first, second and third sets of connections is a ball grid array.

16. The package of claim 15 wherein the cavity contains at least one electronic component.

17. The package of claim 16 wherein the at least one component inside the cavity is attached to a bottom surface of the first circuitized card or a top surface of the second circuitized card and wherein the at least one component is attached to the bottom surface of the first circuitized card or the top surface of the second circuitized card through surface mount attachment, direct chip attachment or through-hole attachment.

18. The package of claim 16 wherein the first circuitized card has a top surface and there is at least one component attached to the top surface of the first circuitized card through surface mount attachment, direct chip attachment or through-hole attachment.

19. The package of claim 15 wherein the interposer acts as a Faraday shield for electronic components placed inside the cavity.

20. The package of claim 19 wherein the interposer has at least one connection to at least one ground.

21. The package of claim 20 wherein the at least one connection is a multiplicity of connections to the at least one ground, the distance between a connection and its closest neighboring connection being approximately equal.

22. The package of claim 15 wherein the opening is square or rectangular and is in the approximate center of the interposer.

23. The package of claim 15 wherein there is at least one electronic component mounted to the top surface of the first circuitized card.

24. The package of claim 15 wherein there is at least one electronic component mounted to the bottom surface of the first circuitized card.

25. The package of claim 15 wherein there is at least one electronic component mounted to the top surface of the second circuitized card.

26. The package of claim 15 wherein the interposer has at least one electronic component on its surface.

27. The package of claim 15 further comprising a third circuitized card and a second interposer having a second opening, wherein the third circuitized card, the second circuitized card, and the second opening in the second interposer define a second cavity for containing at least one electronic component, wherein the third circuitized card is electrically connected to the second interposer through a fourth set of connections, and wherein the second interposer is electrically connected to the second circuitized card through a fifth set of connections.

28. A package for containing electronic components, the package comprising:
- a first circuitized card having a top and bottom surface;
- a second circuitized card having a top and bottom surface;
- an interposer having an opening a top surface, and a bottom surface, the interposer being electrically connected to the first circuitized card and the second circuitized card through a first and second set of connections, the first set of connections being interposed between the bottom surface of the first circuitized card and the top surface of the interposer, the second set of connections being interposed between the bottom surface of the interposer and the top surface of the second circuitized card, wherein (a) the bottom surface of the second circuitized card has a third set of connections for attaching the second circuitized card to a system card, (b) the opening in the interposer, the bottom surface of the first circuitized card, and the top surface of the second circulitized card form a cavity for containing at least one electronic component, (c) the Interposer, first circuitized card, and second circuitized card are circuitized multi-layer organic laminate cards, and (d) said interposer has at least one electronic component on its surface.

* * * * *